(12) United States Patent
Park

(10) Patent No.: US 8,222,656 B2
(45) Date of Patent: Jul. 17, 2012

(54) SEMICONDUCTOR LIGHT EMITTING DEVICE

(75) Inventor: Hyung Jo Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 4 days.

(21) Appl. No.: 12/619,038

(22) Filed: Nov. 16, 2009

(65) Prior Publication Data

US 2010/0123148 A1 May 20, 2010

(30) Foreign Application Priority Data

Nov. 17, 2008 (KR) .................. 10-2008-0114280

(51) Int. Cl.
*H01L 33/00* (2010.01)
(52) U.S. Cl. .................................... 257/94
(58) Field of Classification Search ............ 257/94
See application file for complete search history.

(56) References Cited

U.S. PATENT DOCUMENTS

| | | | |
|---|---|---|---|
| 7,683,386 B2* | 3/2010 | Tanaka et al. ............... | 257/88 |
| 2002/0195609 A1* | 12/2002 | Yoshitake et al. .......... | 257/81 |
| 2004/0119082 A1* | 6/2004 | Sugawara .................. | 257/94 |
| 2005/0087884 A1* | 4/2005 | Stokes et al. ............... | 257/778 |
| 2005/0139842 A1* | 6/2005 | Murofushi et al. ......... | 257/79 |
| 2007/0194324 A1 | 8/2007 | Kim et al. | |
| 2007/0202624 A1 | 8/2007 | Yoon et al. | |
| 2008/0061315 A1* | 3/2008 | Hata ............................. | 257/99 |
| 2010/0012920 A1* | 1/2010 | Park et al. ................... | 257/13 |
| 2010/0123147 A1* | 5/2010 | Jeong .......................... | 257/94 |
| 2010/0230714 A1 | 9/2010 | Shinohara et al. | |

FOREIGN PATENT DOCUMENTS

| | | |
|---|---|---|
| CN | 1638156 A | 7/2005 |
| CN | 1971955 A | 5/2007 |
| JP | 2006-344710 A | 12/2006 |
| JP | 2007-227938 A | 9/2007 |
| JP | 2007-258446 A | 10/2007 |
| JP | 2008-91862 A | 4/2008 |

* cited by examiner

*Primary Examiner* — David Vu
*Assistant Examiner* — Brandon Fox
(74) *Attorney, Agent, or Firm* — Birch, Stewart, Kolasch & Birch, LLP

(57) ABSTRACT

Provided are a semiconductor light emitting device and a method for manufacturing the same. The semiconductor light emitting device comprises a plurality of compound semiconductor layers, a first electrode, a second electrode layer, and a conductive support member. The plurality of compound semiconductor layers comprises a first conductive type semiconductor layer, an active layer, and a second conductive type semiconductor layer. The first electrode is formed under the compound semiconductor layer. The second electrode layer is formed on the compound semiconductor layer. The second electrode layer has an unevenness. The conductive support member is formed on the second electrode layer.

20 Claims, 4 Drawing Sheets

SEMICONDUCTOR LIGHT EMITTING DEVICE

CROSS-REFERENCE TO RELATED APPLICATIONS

The present application claims priority under 35 U.S.C. 119 and 35 U.S.C. 365 to Korean Patent Application No. 10-2008-0114280 (filed on Nov. 17, 2008), which is hereby incorporated by reference in its entirety.

BACKGROUND

The present disclosure relates to a semiconductor light emitting device.

Group III-V nitride semiconductors are being widely used as the core materials of light emitting devices such as Light Emitting Diodes (LEDs) and Laser Diodes (LDs) due to their physical and chemical characteristics. The group III-V nitride semiconductors include semiconductor materials expressed as the chemical formula of $In_xAl_yGa_{1-x-y}N$ (where $0 \leq x \leq 1$, $0 \leq y \leq 1$, and $0 \leq x+y \leq 1$).

The LED is a sort of semiconductor device that converts electrical signals into optical signals (e.g., infrared rays or other light) using the characteristics of compound semiconductors to use the optical signals as transmission/reception signals or light sources.

The LED or LD using nitride semiconductor materials is widely used for light emitting devices to obtain light. For example, the LED or LD is applied to various products such as a light emitting portion of keypads of mobile phones, electronic display boards and lighting devices as a light source.

SUMMARY

Embodiments provide a semiconductor light emitting device comprising a second electrode layer having an unevenness on a light emitting structure.

Embodiments provide a semiconductor light device comprising a discontinuous first semiconductor layer and a second electrode layer having an unevenness on a compound semiconductor layer.

An embodiment provides a semiconductor light emitting device comprising: a plurality of compound semiconductor layers comprising a first conductive type semiconductor layer, an active layer, and a second conductive type semiconductor layer; a first electrode under the plurality of compound semiconductor layers; a second electrode layer having an unevenness on the plurality of compound semiconductor layers; and a conductive support member on the second electrode layer.

An embodiment provides a semiconductor light emitting device comprising: a plurality of compound semiconductor layers comprising a first conductive type semiconductor layer, an active layer, and a second conductive type semiconductor layer; a first electrode under the plurality of compound semiconductor layers; a light-transmitting channel layer around a circumference of an upper surface of the plurality of compound semiconductor layers; a second electrode layer having an unevenness on the compound semiconductor layer, and a conductive support member on the second electrode layer.

An embodiment provides a semiconductor light emitting device comprising: a plurality of compound semiconductor layers comprising a first conductive type semiconductor layer, an active layer, and a second conductive type semiconductor layer; a first semiconductor layer discontinuously protruding from the second conductive type semiconductor layer; a first electrode under the first conductive type semiconductor layer; a light-transmitting channel layer around a circumference of an upper surface of the second conductive type semiconductor layer; a second electrode layer on the second conductive type semiconductor layer and the first semiconductor layer; and a conductive support member on the second electrode layer.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In description of embodiments, the 'on' or 'under' of each layer may be described with reference to the accompanying drawings, and the thickness of the each layer will also be described as an example and is not limited to the thickness shown in the accompanying drawings.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'.

Figure 1:
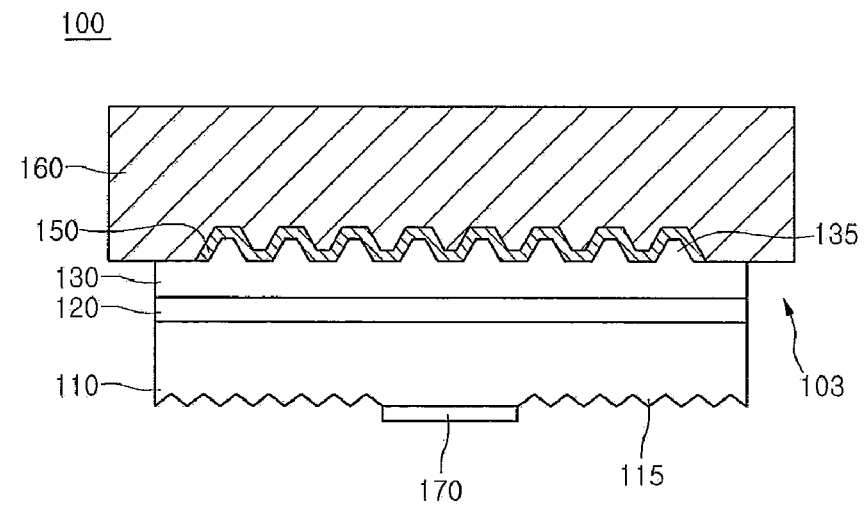
FIG. 1 is a side-sectional view illustrating a semiconductor light emitting device according to a first embodiment.
Figure 2:
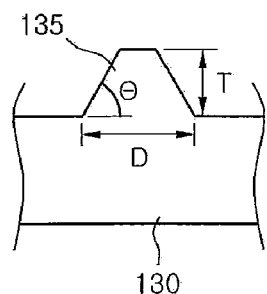
FIG. 2 is a view illustrating a protruding structure of a second conductive type semiconductor layer of FIG. 1.
Figure 3:
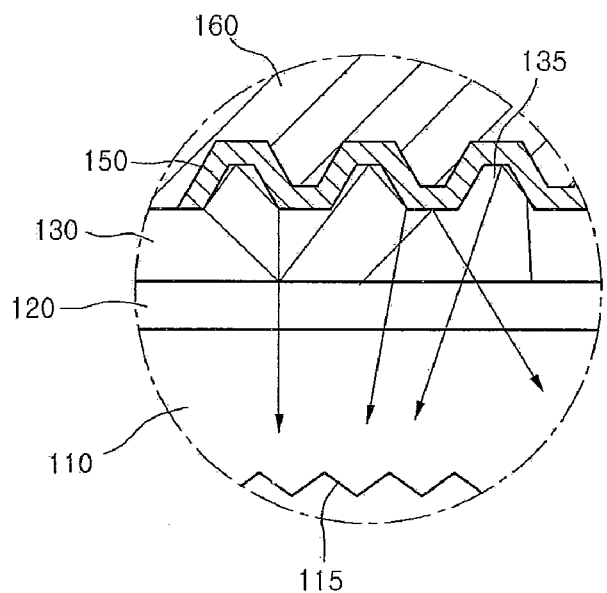
FIG. 3 is a view illustrating an example of light reflection at an interface between the second conductive type semiconductor layer and the second electrode layer of FIG. 1.

FIG. 1 is a side-sectional view illustrating a semiconductor light emitting device according to a first embodiment. FIG. 2 is a view illustrating a protruding structure of a second conductive type semiconductor layer of FIG. 1. FIG. 3 is a view illustrating an example of light reflection at an interface between the second conductive type semiconductor layer and the second electrode layer of FIG. 1.

Referring to FIG. 1, a semiconductor light emitting device 100 includes a first conductive type semiconductor layer 110, an active layer 120, a second conductive type semiconductor layer 130, a first semiconductor layer 135, a second electrode layer 150 of an uneven shape, a conductive support member 160, and a first electrode 170.

The semiconductor light emitting device 100 includes an LED using a plurality of compound semiconductors, for example, compound semiconductors of group III-V elements. The LED may be a colored LED or a UV LED which emits blue light, green light, or red light. Light emitted by the LED may be diversely implemented within the technical scope of embodiments.

The plurality of compound semiconductor layers include a first conductive type semiconductor layer 110, an active layer 120, and a second conductive type semiconductor layer 130.

The first conductive type semiconductor layer 110 may be selected from the compound semiconductors of group III-V elements doped with a first conductive type dopant, for example, GaN, AlN, AlGaN, InGaN, InN, InAlGaN, AlInN, AlGaAs, GaP, GaAs, GaAsP and AlGaInP. When the first conductive type semiconductor layer 110 is an N-type semiconductor layer, the first conductive type dopant may include an N-type dopant such as Si, Ge, Sn, Se, Te. The first conductive type semiconductor layer 110 may be formed as a mono- or a multi-layer, but is not limited thereto.

A first electrode 170 is formed under the first conductive type semiconductor layer 110. The first electrode 170 is formed in a certain shape or pattern, but is not limited thereto. A roughness pattern 115 may be formed on the undersurface of the first conductive type semiconductor layer 110.

The active layer 120 is formed on the first conductive type semiconductor layer 110, and may be formed in a single- or a multiple quantum well structure. The active layer 120 may be formed to have the periodic lamination of a well layer and a barrier layer, for example, an InGaN well layer/GaN barrier layer, an InGaN well layer/AlGaN barrier layer, or InGaN well layer/InGaN well layer using the compound semiconductor materials of group III-V elements. A conductive type clad layer may be formed on and/or under the active layer 120, and may be formed of a GaN-based semiconductor.

The second conductive type semiconductor layer 130 may be formed on the active layer 120, and may be selected from the compound semiconductors of group III-V elements doped with a second conductive type dopant, for example, GaN, AlN, AlGaN, InGaN, InN, InAlGaN, AlInN, AlGaAs, GaP, GaAs, GaAsP and AlGaInP. When the second conductive type semiconductor layer 130 is a P-type semiconductor layer, the second conductive type dopant may include a P-type dopant such as Mg and Zn. The second conductive semiconductor layer 130 may be formed in a mono- or a multi-layer, but is not limited thereto.

The first conductive type semiconductor layer 110, the active layer 120, and the second conductive type semiconductor layer 130 may be defined as a light emitting structure.

An N-type semiconductor layer or a P-type semiconductor layer may be formed on the second conductive type semiconductor layer 130. The first conductive type semiconductor layer 110 may be implemented in a P-type semiconductor layer, and the second conductive type semiconductor layer 130 may be implemented in an N-type semiconductor layer. Thus, the light emitting structure may include at least one of an N-P junction, a P-N junction, an N-P-N junction, and a P-N-P junction.

The first semiconductor layer 135 is formed on the second conductive type semiconductor layer 130. The first semiconductor layer 135 may be protruded from the upper surface of the second conductive type semiconductor layer 130, and may be formed at a regular or irregular interval. The first semiconductor layer 135 is formed to have a discontinuous protrusion, for example, a cone shape or a pyramid shape.

The first semiconductor layer 135 may be formed of the same or different semiconductor material from the second conductive type semiconductor layer 130. The first semiconductor layer 135 may be formed of at least one of, for example, GaN, AlN, AlGaN, InGaN, InN, InAlGaN, AlInN, AlGaAs, GaP, GaAs, GaAsP, and AlGaInP. The first semiconductor layer 135 may be formed of an undoped semiconductor layer, a semiconductor layer doped with a first conductive type dopant, a semiconductor doped with a second conductive type dopant.

Referring to FIG. 2, the thickness T of the first semiconductor layer 135 may ranges from about 0.1 μm to about 2 μm. The maximum diameter of the first semiconductor layer 135 may ranges from about 1.0 μm to about 10 μm.

One side surface of the first semiconductor layer 135 may be inclined at an inside angle θ of, for example, about 55 degrees to about 57 degrees with the respect to the horizontal surface of the second conductive type semiconductor layer 130. Here, the inside angle θ of the first semiconductor layer 135 may vary with the crystal properties of a material forming the first semiconductor layer 135. The interval between the protrusions of the first semiconductor layer 135 may range from about 100 nm to about 100 μm.

The shape of the first semiconductor layer 135 may be formed in a three-dimensional shape, for example, a cone shape or a pyramid shape with various base surfaces such as a diamond shape, having an inclined sidewall, but can be modified within the technical scope of the embodiments. The first semiconductor layer 135 may be formed in a tapered shape, the width of the upper part of which is smaller than that of the lower part.

Here, the first semiconductor layer 135 may be formed at a regular or irregular interval on the second conductive type semiconductor layer 130 through a selective growth or etching method.

Referring to FIG. 1, the first semiconductor layer 135 is protruded from the surface of the second conductive type semiconductor layer 130 to have an uneven structure.

A second electrode layer 150 is formed on the second conductive type semiconductor layer 130 and the first semiconductor layer 135. The undersurface of the second electrode layer 150 may have an uneven shape corresponding to the shape of the first semiconductor layer 135.

The uneven shape of the second electrode layer 150 may have the same angle and shape as the shape of the first semiconductor layer 135. The protruding shape of the second electrode layer 150 may be inclined. The second electrode layer 150 may be formed in a cone or inverse-cone shape along the second conductive type semiconductor layer 130.

The second electrode layer 150 may include at least one of an ohmic contact layer, a reflection layer, and an adhesive layer. The ohmic contact layer may include at least one of, for example, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO) and antimony tin oxide (ATO), gallium zinc oxide (GZO), IrOx, RuOx, RuOx/ITO, Ni/IrOx/Au, Ni/IrOx/Au/ITO, Pt, Ni, Au, Rh and Pd. The reflection layer may include a layer formed of Ag, Ni, Al, Rh, Pd, Ir, Ru, Mg, Zn, Pt, Au, Hf, or an alloy of at least two thereof. The adhesive layer may include at least one of Ti, Au, Sn, Ni, Cr, Ga, In, Bi, Cu, Ag, and Ta.

The second electrode layer 150 may be used as a seed layer for a plating process.

The recess of the second electrode layer 150 is formed on the second conductive type semiconductor layer 130, and the protrusion of the second electrode layer 150 is formed to have a shape corresponding to the first semiconductor layer 135. At least one of the recess and protrusion of the second electrode layer 150 may be formed to be an inferior conductive region.

Also, an ohmic contact layer (not shown) may be formed between the second electrode layer 150 and the second conductive type semiconductor layer 130. The ohmic contact layer may be formed to have a layered shape or a multiple-pattern on the second conductive type semiconductor layer 130, but is not limited thereto. The ohmic contact layer may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO) and antimony tin oxide (ATO), gallium zinc oxide (GZO), IrOx, RuOx, RuOx/ITO, Ni/IrOx/Au, Ni/IrOx/Au/ITO, Ni/IrOx/Au, and Ni/IrOx/Au/ITO, but embodiments are not limited thereto. A nonconductor layer, for example, an MgN layer may be formed between the second electrode layer 150 and the second conductive type semiconductor layer 130. The nonconductor layer may be disposed between the discontinuous first semiconductor layers 135.

The first semiconductor layer 135 may be formed of a semiconductor of the same or different polarity from the second conductive type semiconductor layer 130. The first semiconductor layer 130 may be formed of an undoped semiconductor, a semiconductor doped with a first conductive type dopant, or a semiconductor doped with a second conductive type dopant.

When the first semiconductor layer 135 is formed of an undoped semiconductor or a first conductive type semiconductor, a current applied to the second electrode layer 150 may be supplied to the second conductive type semiconductor layer 130 disposed between the first semiconductor layers 135.

When a nonconductor layer is disposed between the first semiconductor layers 135, the current applied to the second electrode layer may be supplied to the second conductive type semiconductor layer 130 through the first semiconductor layer 135.

When the first semiconductor layer 135 is a second conductive type semiconductor, the current applied to the second electrode layer 150 may be supplied to the first semiconductor layer 135 and the second conductive type semiconductor layer 130.

A conductive support member 160 may be formed on the second electrode layer 150, and may serve as a base substrate. The conductive support member 160 may be implemented using Cu, Au, Ni, Mo, Cu—W, and carrier wafer such as Si, Ge, GaAs, ZnO, SiC, SiGe, and GaN. The conductive support member 160 may be formed by an electroplating method, or may be formed in a sheep shape, but is not limited thereto.

The lower part of the conductive support member 160 may be formed to have a structure corresponding to the unevenness of the second electrode layer 150. The thickness of the conductive support member 160 may range from about 30 µm to about 150 µm, but embodiments are not limited thereto. The second electrode layer 150 and the conductive support member 160 may be formed as a reflection electrode layer, for example, a second electrode unit, but is not limited thereto.

The semiconductor light emitting device 100 is supplied with power through the first electrode 170 and the conductive support member 160, light is emitted from the active layer 120 in all directions.

A portion of the light emitted from the active layer 120 travels to the second electrode layer 150. The second electrode layer 150 may change the critical angle of the incident light using the unevenness structure, thereby improving the external quantum efficiency.

Referring to FIGS. 1 and 3, the light emitting to the second electrode layer 150 is reflected by the change of the critical angle. The second electrode layer 150 changes the reflection angle of the incident light. In this case, the second electrode layer 150 may change the reflection angle of light smaller than the critical angle that allows the emission of light, thereby increasing a possibility that light is extracted to the outside.

Embodiments can improve the external quantum efficiency using a discontinuous first semiconductor layer 135 and a second electrode layer 150 having an uneven shape on a plurality of compound semiconductor layers or a light emitting structure.

FIGS. 4 through 8 are views illustrating a process for manufacturing a semiconductor light emitting device according to a first embodiment.

Figure 4:
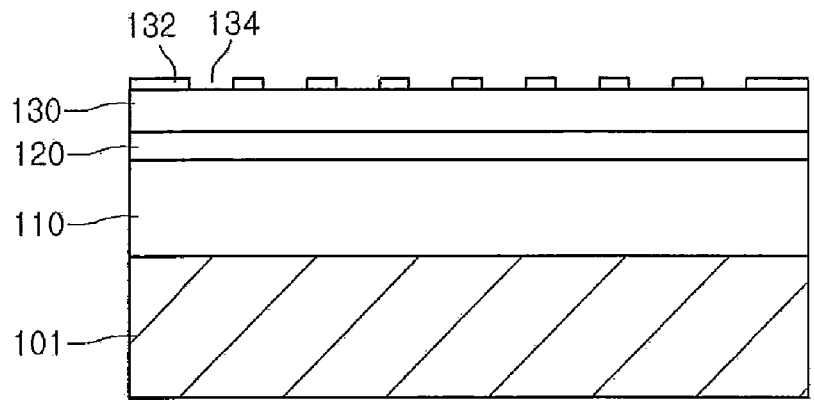
FIGS. 4 through 8 are views illustrating a process for manufacturing a semiconductor light emitting device according to a first embodiment.

Referring to FIG. 4, a substrate 101 is loaded into a growth system, and a compound semiconductor layer of group ☐ to ☐ elements may be grown thereon.

The examples of the growth systems may include electron beam evaporator, Physical Vapor Deposition (PVD), Chemical Vapor Deposition (CVD), Plasma Laser Deposition (PLD), dual-type thermal evaporator, sputtering and Metal Organic Chemical Vapor Deposition (MOCVD), but embodiments are not limited to these systems.

The substrate 101 may be selected from the group consisting of sapphire substrate (Al2O3), GaN, SiC, ZnO, Si, GaP, InP, $Ga_2O_3$, a conductive substrate, and GaAs. An unevenness pattern may be formed over the surface of the substrate 101. At least one layer or pattern, for example, a ZnO layer (not shown), a buffer layer (not shown), or an undoped semiconductor layer (not shown), which is formed of compound semiconductors of group ☐ to ☐ elements, may be formed over the substrate 101.

The buffer layer and the undoped semiconductor layer may be formed using compound semiconductors of group III-V elements. The buffer layer may reduce a difference in lattice constant from the substrate 101. The undoped semiconductor layer may be formed of an undoped GaN-based semiconductor.

A light emitting structure including a plurality of compound semiconductor layers is formed on the substrate 101. The light emitting structure includes a first conductive type semiconductor layer 110, an active layer 120 on the first conductive semiconductor layer 110, and a second conductive type semiconductor layer 130 on the active layer 120.

The first conductive type semiconductor layer 110 may be selected from the compound semiconductors of group III-V elements doped with a first conductive type dopant, for example, GaN, AlN, AlGaN, InGaN, InN, InAlGaN, AlInN, AlGaAs, GaP, GaAs, GaAsP and AlGaInP. When the first conductive type semiconductor 110 is an N-type semiconductor layer, the first conductive type dopant includes an N-type dopant such as Si, Ge, Sn, Se and Te. The first conductive type semiconductor layer 110 may be formed as a mono- or multi-layer, but is not limited thereto.

The active layer 120 is formed on the first conductive type semiconductor layer 110, and may be formed in a single- or a multiple quantum well structure. The active layer 120 may be formed to have the periodic lamination of a well layer and a barrier layer, for example, an InGaN well layer/GaN barrier layer, an InGaN well layer/AlGaN barrier layer, or InGaN well layer/InGaN barrier layer using the compound semiconductor materials of group III-V elements.

A conductive type clad layer may be formed on and/or under the active layer 120, and may be formed of a GaN-based semiconductor.

The second conductive semiconductor layer 130 is formed on the active layer 120, and may be selected from the compound semiconductors of group III-V elements doped with a second conductive type dopant, for example, GaN, AlN, AlGaN, InGaN, InN, InAlGaN, AlInN, AlGaAs, GaP, GaAs, GaAsP and AlGaInP. When the second conductive type semiconductor layer 130 is a P-type semiconductor layer, the second conductive type dopant may include a P-type dopant such as Mg and Zn. The second conductive type semiconductor layer 130 may be formed as a mono- or multi-layer, but is not limited thereto.

The second conductive type semiconductor layer 130 may include a P-type GaN layer that is formed to have a certain thickness by supplying a gas including P-type dopant such as $NH_3$, TMGa (or TEGa), and $Mg(CP_2Mg)$.

The first conductive type semiconductor layer 110, the active layer 120, and the second conductive type semiconductor layer 130 may be defined as a light emitting structure. A third conductive type semiconductor layer, for example, an N-type semiconductor layer or a P-type semiconductor layer may be formed on the second conductive type semiconductor layer 130. Thus, the light emitting structure may include at least one of an N-P junction, a P-N junction, an N-P-N junction, and a P-N-P junction.

Figure 5:
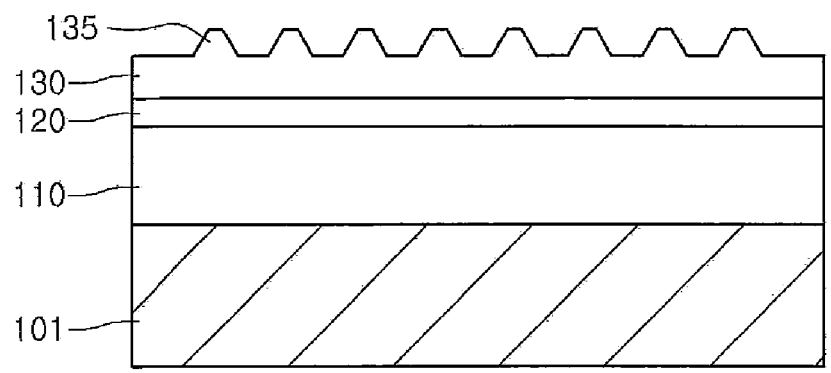

Referring to FIGS. 4 and 5, the second conductive type semiconductor layer 130 is grown with a certain thickness. A mask pattern 132 is formed on the second conductive type semiconductor layer 130. A plurality of opening regions 134 may be formed at a regular or irregular interval on the mask pattern 132. The opening region 134 of the mask pattern 132 may have a diameter ranging from about 1.0 μm to about 10 μm. The interval between the opening regions 134 of the mask pattern 132 may range from about 100 nm to about 100 μm.

The second conductive type semiconductor layer 130 is re-grown. For example, a P-type GaN layer may be formed to have a certain thickness by supplying a gas including P-type dopant such as $NH_3$, TMGa (or TEGa), and $Mg(CP_2Mg)$. In this case, the growth temperature and pressure may be adjusted to form the P-type layer. Thus, a first semiconductor layer 135 is formed using the opening region 134 of the mask pattern 132. The first semiconductor layer 135 may be formed to have a three-dimensional shape, which has a vertical section of a triangular shape or a polygonal shape (e.g., trapezoid) and a base plane of a circular or polygonal (e.g., hexagonal) shape. Also, the inclination of the first semiconductor layer 135 may have an inside angle θ ranging from about 55 degrees to about 57 degrees with respect to the upper surface of the second conductive type semiconductor layer 130 as shown in FIG. 2.

If the first semiconductor layer 135 is formed on the second conductive type semiconductor layer 130, the mask pattern 132 may be removed.

Here, methods for forming the first semiconductor layer 135 will be described as follows. There are two exemplary methods for forming the first semiconductor layer 135. In a first method, after the second conductive type semiconductor layer 130 may be grown to a certain thickness, a dry and/or wet etching may be performed using a mask pattern to form the first semiconductor layer 135 as described above. Here, the first semiconductor layer 135 may be formed of the same material as the second conductive type semiconductor layer 130, but is not limited thereto.

In a second method, a nonconductor layer having an opening region may be formed on the second conductive type semiconductor layer 130. The nonconductor layer may be implemented using an MgN layer, but is not limited thereto. The first semiconductor layer 135 may be formed using the opening region of the nonconductor layer. Here, the MgN layer may be formed using Mg and ammonia ($NH_3$). The MgN layer may be formed to have an irregular pattern. Thus, the first semiconductor layer 135 may be formed at an irregular interval on the second conductive type semiconductor layer 130. Thereafter, the MgN layer may or may not be removed. Since the MgN layer is a nonconductor, a current applied to the second electrode layer may be supplied to the second conductive type semiconductor layer 130 through the first semiconductor layer 135.

Consequently, the first semiconductor layer 135 may be formed to have an uneven shape on the second conductive type semiconductor layer 130.

The first semiconductor layer 135 may be formed of the same or different semiconductor material from the second conductive type semiconductor layer 130. The first semiconductor layer 135 may be formed of at least one of, for example, GaN, AlN, AlGaN, InGaN, InN, InAlGaN, AlInN, AlGaAs, GaP, GaAs, GaAsP, and AlGaInP. The first semiconductor layer 135 may be formed of a semiconductor of the same or different polarity from the second conductive type semiconductor layer 130. The first semiconductor layer 135 may be formed of an undoped semiconductor layer, a semiconductor layer doped with a first conductive type dopant, a semiconductor doped with a second conductive type dopant.

Figure 6:
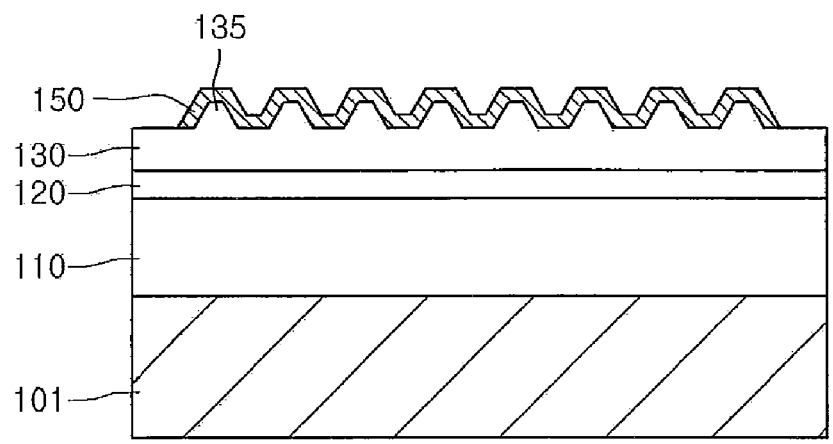

Referring to FIG. 6, a second electrode layer 150 is formed on the second conductive type semiconductor layer 130. The second electrode layer 150 may be formed in an inside region or on the entire surface of the second conductive type semiconductor layer 130, but is not limited thereto.

The second electrode layer 150 may include at least one of an ohmic contact layer, a reflection layer, and an adhesive layer. The ohmic contact layer may include at least one of, for example, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO) and antimony tin oxide (ATO), gallium zinc oxide (GZO), IrOx, RuOx, RuOx/ITO, Ni/IrOx/Au, Ni/IrOx/Au/ITO, Pt, Ni, Au, Rh and Pd. The reflection layer may include a layer formed of Ag, Ni, Al, Rh, Pd, Ir, Ru, Mg, Zn, Pt, Au, Hf, or an alloy of at least two thereof. The adhesive layer may include at least one of Ti, Au, Sn, Ni, Cr, Ga, In, Bi, Cu, Ag, and Ta.

The second electrode layer 150 may include a seed layer. The seed layer may include at least one of Ti, Cr, Ta, Cr/Au, Cr/Cu, Ti/Au, Ta/Cu, and Ta/Ti/Cu.

The second electrode layer 150 may formed to have an uneven shape along the shape of the first semiconductor layer 135 of the second conductive type semiconductor layer 130. The recess of the second electrode layer 150 may have an inverse cone shape, and the protrusion thereof may have a cone shape.

Here, the recess of the second electrode layer 150 may contact the second conductive type semiconductor layer 130, and the protrusion thereof may contact the first semiconductor layer 135.

When the first semiconductor layer 135 is an undoped semiconductor or a first conductive type semiconductor, a current applied to the second electrode layer 150 may be supplied to the second conductive type semiconductor layer 130 disposed between the first semiconductor layers 135.

When a nonconductor layer is disposed between the first semiconductor layers 135, the current applied to the second electrode layer may be supplied to the second conductive type semiconductor layer 130 through the first semiconductor layer 135.

When the first semiconductor layer 135 is a second conductive type semiconductor, the current applied to the second electrode layer 150 may be supplied through the first semiconductor layer 135 and the second conductive type semiconductor layer 130.

Also, an ohmic contact layer (not shown) may be formed between the second electrode layer 150 and the second conductive type semiconductor layer 130. The ohmic contact layer may be formed with a layered shape or multiple-pattern before the second electrode layer 150 is formed. The ohmic contact layer may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO) and antimony tin oxide (ATO), gallium zinc oxide (GZO), IrOx, RuOx, RuOx/ITO, Ni/IrOx/Au, Ni/IrOx/Au/ITO, Ni/IrOx/Au, and Ni/IrOx/Au/ITO.

Figure 7:
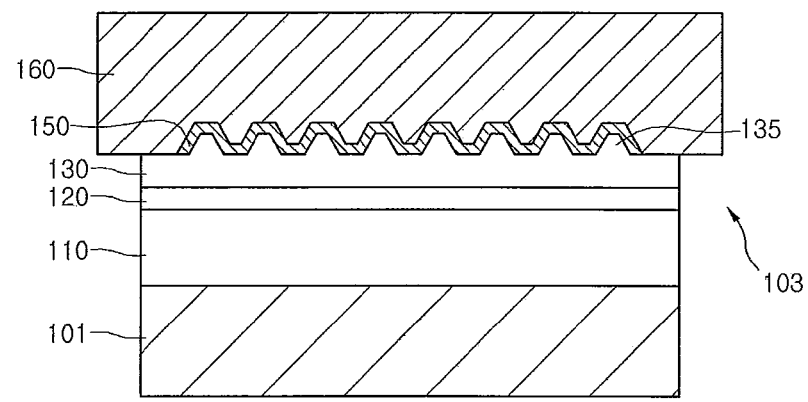

Referring to FIG. 7, a conductive support member 160 may be formed on the second electrode layer 150, and may serve as a base substrate. The conductive support member 160 may be implemented using Cu, Au, Ni, Mo, Cu—W, and carrier wafer such as Si, Ge, GaAs, ZnO, SiC, SiGe, and GaN.

The conductive support member 160 may be formed by an electroplating method, or may be formed in a sheep shape, but is not limited thereto. The thickness of the conductive support member 160 may range from about 30 μm to about 150 μm, but embodiments are not limited thereto.

The lower part of the conductive support member 160 may be formed to have an evenness matching the unevenness of the second electrode layer 150.

Figure 8:
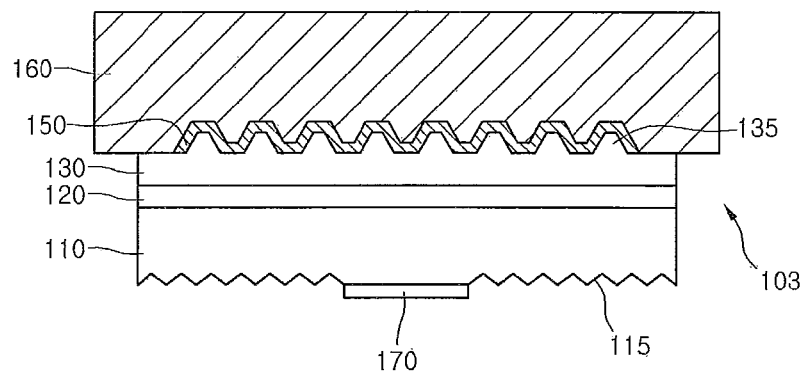

Referring to FIGS. 7 and 8, the conductive support member 160 may be positioned at the base after the conductive support member 160 is formed. Then, the substrate 101 may be removed through a physical and/or chemical removal method.

Through the physical removal method, the substrate 101 may be separated by a Laser Lift Off (LLO) of irradiating a laser having a wavelength of a certain range on the substrate. In the chemical removal method, when another semiconductor layer (e.g., buffer layer) is interposed between the substrate 101 and the first conductive type semiconductor layer 110, the substrate 101 may be separated by using a wet etchant to remove the buffer layer.

An etching process such as Inductively Coupled Plasma/Reactive Ion Etching (ICP/RIE) or a grinding process may be performed on the surface of the first conductive type semiconductor layer 110 after the substrate 101 is removed.

The unevenness of the first semiconductor layer 135 of the second conductive type semiconductor layer 130 and the second electrode layer 150 may reinforce an adhesive strength between the compound semiconductor layer (e.g., 130) and the second electrode layer 150. Accordingly, even when a laser of the LLO method is irradiated, a peeling between the compound semiconductor layer 130 and the second electrode layer 150 can be overcome.

A roughness pattern 115 may be formed on the undersurface of the first conductive type semiconductor layer 110 through a wet and/or dry etching method.

Then, after a mesa etching is performed on a boundary region between chips (i.e., channel region), the semiconductor light emitting device 100 may be separated into unit chips. A first electrode 170 having a certain pattern may be formed under the first conductive type semiconductor layer 110. Here, a process for forming the first electrode 170 may be performed before or after the mesa etching, or after the separation of the semiconductor light emitting device 100, but is not limited thereto. The first conductive type semiconductor layer 110, the active layer 120, and the second conductive type semiconductor layer 130 may be formed to have outer edges 103 thereof partially cut away. However, the mesa etching is merely a process for separation between chips, and embodiments are not limited thereto.

If a forward current is applied to the semiconductor light emitting device 100 through the first electrode 170 and the conductive support member 160, light is emitted from the active layer 120 in all directions. In this case, the light incident to the first semiconductor layer 135 and the second electrode layer 150 of the second conductive type semiconductor layer 130 may be reflected by a change of the critical angle. That is, the reflection angle of the light incident to the second electrode layer 150 of the unevenness structure may be changed to be reflected. The second electrode layer 150 can reflect light having a reflection angle smaller than the critical angle that allows the emission of light. In this case, the light can be reflected at a greater angle than the critical angle, thereby improving the light extraction efficiency.

Figure 9:
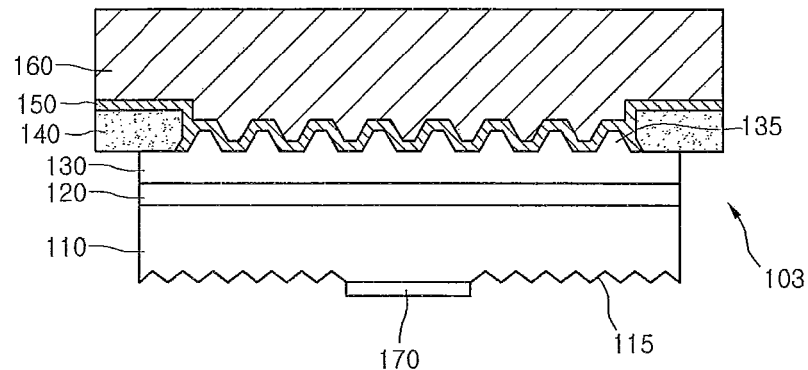
FIG. 9 is a side cross-sectional view of a semiconductor light emitting device according to a second embodiment.

FIG. 9 is a side cross-sectional view of a semiconductor light emitting device according to a second embodiment. In the description of the second embodiment, detailed descriptions of identical parts to those of the first embodiment will be substituted with those of the first embodiment and be omitted herein.

Referring to FIG. 8, a semiconductor light emitting device 100A includes a light-transmitting channel layer 140 surrounding the circumference of the upper surface of the second conductive type semiconductor layer 130.

The channel layer 140 may be formed to have a ring, strip, or flame shape of a continuous or discontinuous pattern along the circumference of the second conductive type semiconductor layer 130. That is, the channel layer 140 may be formed with an open loop shape or closed loop shape. At least a portion of the channel layer 140 may be exposed to a channel region of a light emitting structure, and may be formed to protect the outer wall of the light emitting structure from humidity or short-circuit.

The channel layer 140 may be formed to have a certain width along the circumference of the second conductive type semiconductor layer 130. The inner side of the channel layer 140 is disposed between the second electrode layer 150 and the second conductive type semiconductor layer 130, and the outer side of the channel layer 140 is disposed under the second electrode layer 150. In this case, the outer side of the channel layer 140 is exposed to the channel region 103 of the compound semiconductor layer 110, 120 and 130.

The channel layer 140 may be formed of a light-transmitting insulating material or light-transmitting conductive material, and may include at least one of, for example, $SiO_2$, $SiO_x$, $SiO_xN_y$, $Si_3N_4$, $Al_2O_3$, $TiO_2$, ITO(indium tin oxide), IZO(indium zinc oxide), IZTO(indium zinc tin oxide), IAZO (indium aluminum zinc oxide), IGZO(indium gallium zinc oxide), IGTO(indium gallium tin oxide), AZO(aluminum zinc oxide), ATO(antimony tin oxide), GZO(gallium zinc oxide), IrOx, RuOx, RuOx/ITO, Ni/IrOx/Au, and Ni/IrOx/Au/ITO. Besides the above materials, the channel layer 140 may use a light-transmitting material or a material that is rarely fragmented by a laser light, but embodiments are not limited thereto.

The channel layer 140 may allow the conductive support member 160 to be spaced from the second conductive type semiconductor layer 130. The channel layer 140 may minimize metal material fragments generated by a laser beam during a manufacturing process of a semiconductor.

Figure 10:
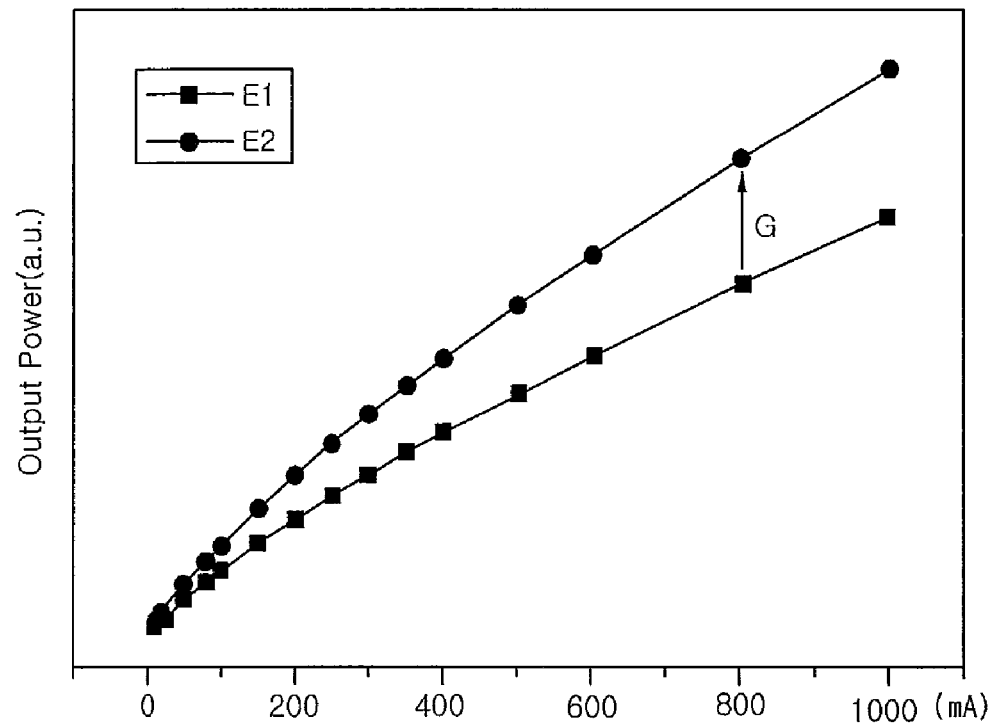
FIG. 10 is a graph illustrating an optical power with respect to an injection current in semiconductor light emitting devices according to a first embodiment and a comparative embodiment.

FIG. 10 is a graph illustrating an optical power with respect to an injection current in semiconductor light emitting devices according to an embodiment and a comparative embodiment.

Referring to FIG. 10, when an injection current of a semiconductor light emitting device is increased, an output power of an embodiment E2 is increased by a certain gap G compared to a comparative embodiment E1. Here, the comparative embodiment E1 represents a case where a first semiconductor layer and a second electrode layer on a second conductive type semiconductor layer are flat.

Figure 11:
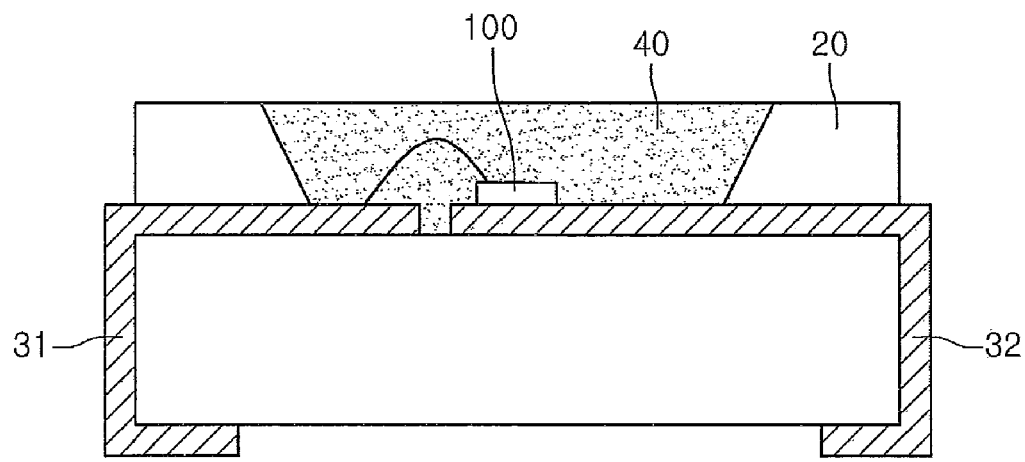
FIG. 11 is a side cross-sectional view illustrating a light emitting device package according to a third embodiment.

FIG. 11 is a side cross-sectional view illustrating a light emitting device package according to a third embodiment.

Referring to FIG. 11, the light emitting package includes a body part 20, first and second lead electrode 31 and 32 in the body part 20, a light emitting device 100 to which the first and second lead electrodes 31 and 32 are electrically connected, and a molding member 40 surrounding the light emitting device 100.

The body part 20 may be formed of silicon, compound resin, or metal, and may have an inclined surface around the light emitting device 100.

The first and second lead electrodes 31 and 32 are electrically isolated from each other, and provide power to the light emitting device 100. Also, the first and second lead electrodes 31 and 32 may reflect light generated in the light emitting device 100, thereby increasing optical efficiency. The first and second lead electrodes 31 and 32 also serve to exhaust heat generated in the light emitting device 100 to the outside.

The light emitting device 100 may be disposed on the body part 20 or the first and second lead electrodes 31 and 32.

The light emitting device 100 may be electrically connected to the first lead electrode 31 through a wire, and may be electrically connected to the lead electrode 32 through a die bonding.

The molding member 40 surrounds the light emitting device 100 to protect the light emitting device 100. Also, the molding member 40 may include a phosphor to change the wavelength of light emitted from the light emitting device 100.

After the semiconductor light emitting device according to the embodiment(s) is die-bonded to the second lead electrode 32 through an insulating substrate or a growth substrate, which is packaged to be used as a light source of indicating devices, lighting device, and displaying devices.

In still further another embodiment, a method for manufacturing a semiconductor light emitting device comprises: forming a plurality of compound semiconductor layers comprising a first conductive type semiconductor layer, an active layer, and a second conductive type semiconductor layer; forming a first semiconductor layer discontinuously protruding from the second conductive type semiconductor layer; forming a second electrode layer a second electrode layer on the second conductive type semiconductor layer and the first semiconductor layer; forming a conductive support member on the second electrode layer; and forming a first electrode under the first conductive type semiconductor layer.

Features, structures, and effects described in the above embodiments are incorporated into at least one embodiment of the present invention, but are not limited to only one embodiment. Moreover, features, structures, and effects exemplified in one embodiment can easily be combined and modified for another embodiment by those skilled in the art. Therefore, these combinations and modifications should be construed as falling within the scope of the present invention.

A semiconductor light emitting device or a light emitting device package according to an embodiment can be used as light sources of displaying device, indicating devices, and lighting devices, but is not limited thereto.

Embodiments can provide a semiconductor light emitting device such as an LED.

Embodiments can improve electrical reliability of a semiconductor light emitting device.

Embodiments can improve optical efficiency of a vertical-type semiconductor light emitting device.

Embodiments can apply light source packaged with a semiconductor light emitting device to lighting devices, indicating devices, and displaying devices.

Embodiments can improve external quantum efficiency.

Embodiments can enhance an adhesive strength between a semiconductor layer and a second electrode layer.

Embodiments can improve reliability of a semiconductor light emitting device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a plurality of compound semiconductor layers comprising a first conductive type semiconductor layer, an active layer, and a second conductive type semiconductor layer;
a first electrode under the first conductive type semiconductor layer; a second electrode layer having an unevenness on the second conductive type semiconductor layer, the second electrode layer being positioned opposite to the first electrode, having the plurality of compound semiconductor layers therebetween; and
a conductive support member on the second electrode layer, the conductive support member having a width which is larger than a width of the second conductive type semiconductor layer,
wherein the unevenness of the second electrode layer is disposed between the second conductive type semiconductor layer and the conductive support member,
wherein the second electrode layer comprises a reflection layer and reflects light emitted by the active layer to a surface direction of the first conductive type semiconductor layer, and
wherein the second conductive type semiconductor layer comprises a second unevenness and the second unevenness corresponds to the unevenness of the second electrode layer, and the second conductive type semiconductor layer is directly disposed on the second electrode layer.

2. The semiconductor light emitting device according to claim 1, wherein the unevenness of the second electrode layer has a three-dimensional shape.

3. The semiconductor light emitting device according to claim 1, comprising a first semiconductor layer between the second conductive type semiconductor layer and the second electrode layer, the first semiconductor layer comprises the second unevenness.

4. The semiconductor light emitting device according to claim 3, wherein the first semiconductor layer is disposed at a regular or irregular interval.

5. The semiconductor light emitting device according to claim 3, wherein the first semiconductor layer comprises the same or different semiconductor material from the second conductive type semiconductor layer.

6. The semiconductor light emitting device according to claim 1, wherein a shape of the unevenness of the second electrode layer comprises sidewalls inclined with respect to the second conductive type semiconductor layer.

7. The semiconductor light emitting device according to claim 6, wherein the inclination of the sidewall is about 55 degrees to about 57 degrees with respect to the second conductive type semiconductor layer.

8. A semiconductor light emitting device, comprising:
a plurality of compound semiconductor layers comprising a first conductive type semiconductor layer, an active layer, and a second conductive type semiconductor layer;
a first electrode under the plurality of compound semiconductor layers;
a light-transmitting channel layer around a circumference of an upper surface of the plurality of compound semiconductor layers;
a second electrode layer having an unevenness on the compound semiconductor layer; and
a conductive support member on the second electrode layer,
wherein the light-transmitting channel layer is disposed between the second conductive type semiconductor layer and the second electrode layer,
wherein the unevenness of the second electrode layer is disposed between the second conductive type semiconductor layer and the conductive support member, and
wherein the second electrode layer comprises a reflection layer and reflects light emitted by the active layer to a surface direction of the first conductive type semiconductor layer.

9. The semiconductor light emitting device according to claim 8, comprising a first semiconductor layer between the second conductive type semiconductor layer and the second electrode layer, the first semiconductor layer comprising a shape corresponding to the second electrode layer.

10. The semiconductor light emitting device according to claim 8, wherein the first semiconductor layer has the same or different polarity from the second conductive type semiconductor layer.

11. The semiconductor light emitting device according to claim 8, wherein the light-transmitting channel layer comprises at least one of $SiO_2$, $SiO_x$, $SiO_xN_y$, $Si_3N_4$, $Al_2O_3$, $TiO_2$, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO) and antimony tin oxide (ATO), gallium zinc oxide (GZO), IrOx, RuOx, RuOx/ITO, Ni/IrOx/Au, Ni/IrOx/Au/ITO.

12. The semiconductor light emitting device according to claim 8, wherein the first semiconductor layer has a thickness of about 0.1 µm to about 2 µm and a maximum diameter of about 1.0 µm about 10 µm.

13. The semiconductor light emitting device according to claim 8, wherein the first semiconductor layer has upper and lower parts of different diameters and an inclined circumference surface.

14. The semiconductor light emitting device according to claim 8, comprising a nonconductor layer comprising MgN between the second conductive type semiconductor layer and the second electrode layer.

15. The semiconductor light emitting device according to claim 8, wherein the second electrode layer is extended on the channel layer.

16. The semiconductor light emitting device according to claim 8, wherein a shape of the unevenness of the second electrode layer comprises a recess and a protrusion.

17. The semiconductor light emitting device according to claim 8, wherein the shape of the unevenness of the second electrode layer comprises sidewalls inclined with respect to the second conductive type semiconductor layer.

18. The semiconductor light emitting device according to claim 17, wherein inclination of the sidewalls is about 55 degrees to about 57 degrees with respect to the second conductive type semiconductor layer.

19. The semiconductor light emitting device according to claim 8, wherein the conductive support member has a larger width than a width of the second conductive type semiconductor layer.

20. The semiconductor light emitting device according to claim 8, wherein an outer-circumference portion of the conductive support member is directly disposed on an outer-circumference portion of the second conductive type semiconductor layer.

* * * * *